United States Patent [19]
Schwalke et al.

[11] Patent Number: 5,470,782
[45] Date of Patent: Nov. 28, 1995

[54] METHOD FOR MANUFACTURING AN INTEGRATED CIRCUIT ARRANGEMENT

[75] Inventors: Udo Schwalke, Heldenstein; Fritz Bieringer, Munich, both of Germany

[73] Assignee: Siemens Aktiengesellschaft, Munich, Germany

[21] Appl. No.: 342,052

[22] Filed: Nov. 17, 1994

[30] Foreign Application Priority Data

Dec. 2, 1993 [DE] Germany .......................... 43 41 171.1

[51] Int. Cl.⁶ ................................. H01L 21/76
[52] U.S. Cl. ................. 437/70; 437/67; 437/62; 437/924; 148/DIG. 102
[58] Field of Search ................. 437/67, 62, 63, 437/924, 70; 148/DIG. 102

[56] References Cited

U.S. PATENT DOCUMENTS

| | | | |
|---|---|---|---|
| 4,893,163 | 1/1990 | Rudeck | 257/797 |
| 4,968,628 | 11/1990 | Delgado et al. | 437/67 |
| 5,032,529 | 7/1991 | Beitman et al. | 437/62 |
| 5,077,228 | 12/1991 | Eklund et al. | 437/40 |
| 5,112,772 | 5/1992 | Wilson et al. | 437/67 |

FOREIGN PATENT DOCUMENTS

| | | | |
|---|---|---|---|
| 0256315A1 | 2/1988 | European Pat. Off. | H01L 21/82 |
| 0562127A1 | 9/1993 | European Pat. Off. | H01L 21/76 |
| 4-209551 | 7/1992 | Japan | H01L 29/72 |

OTHER PUBLICATIONS

International Symposium on Power Semiconductor Devices & ICs, Tokyo, 1990, "New 500V Output Device Structures for Thin Silicon Layer on Silicon Dioxide Film", A. Nakagawa et al, pp. 97–101.

Siemens AG, Corporate Research and Development, Microelectronics—"Optimisation of Selective Polysilicon Oxidation for 0.8µm– Technology".

Silicon Processing for the VLSI Era, 1987, "Lithography II: Optical Alignment Tools and Photomasks", S. Wolf et al, pp. 473–476.

Primary Examiner—Brian E. Hearn
Assistant Examiner—Trung Dang
Attorney, Agent, or Firm—Hill, Steadman & Simpson

[57] ABSTRACT

A trench structure is produced in a substrate wafer in a two-step trench process. A trench mask is produced in a first etching step and the trench structure is realized in the substrate wafer in a second etching step. An auxiliary lithography structure is produced in the substrate wafer in the trench process. A protective structure that protects the substrate wafer in the region of the auxiliary lithography structure against an etching attack in the second etching step is formed in the region of the auxiliary lithography structure in the manufacture of the trench mask.

9 Claims, 4 Drawing Sheets

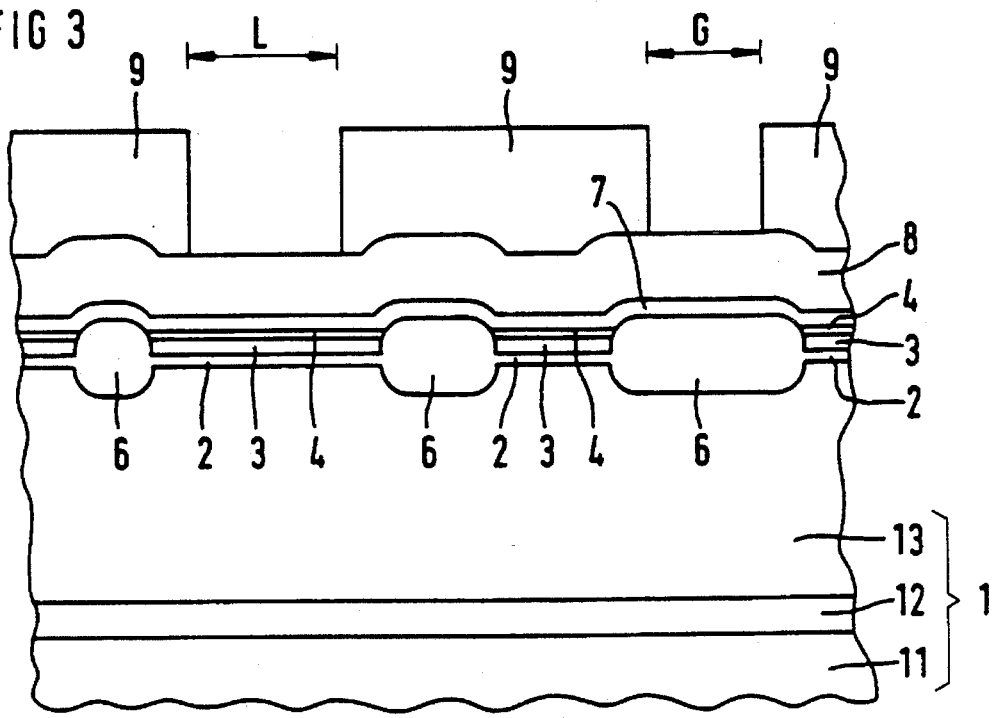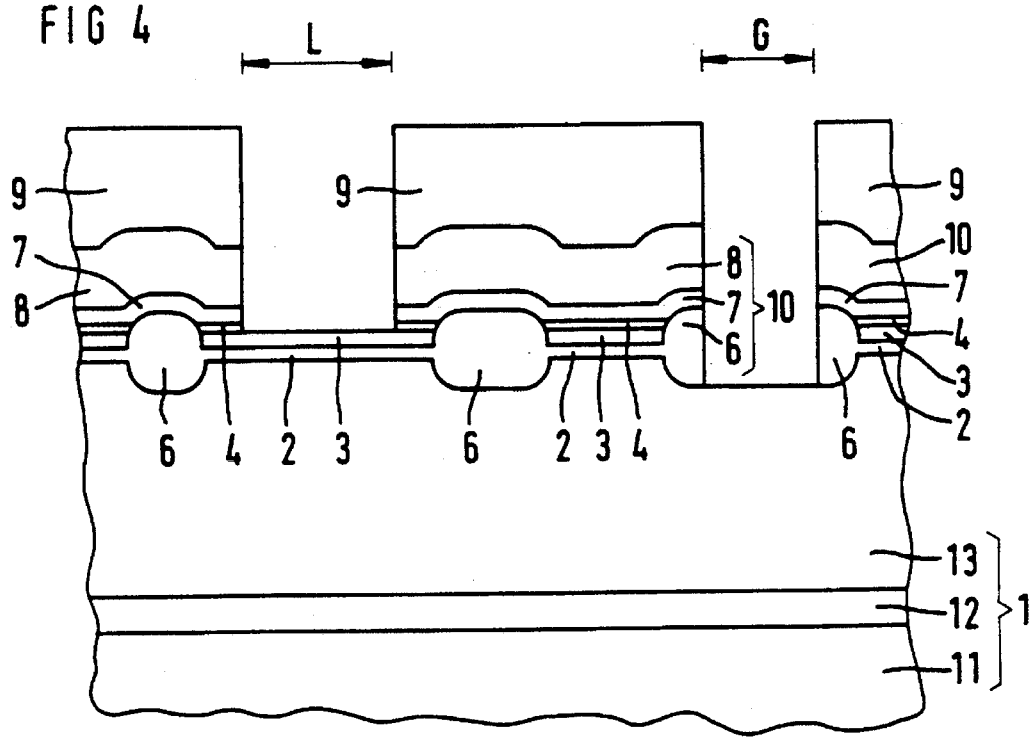

METHOD FOR MANUFACTURING AN INTEGRATED CIRCUIT ARRANGEMENT

BACKGROUND OF THE INVENTION

Complex process sequences having a plurality of lithography steps are required for manufacturing integrated circuits. Auxiliary lithography structures in every mask level are produced in the process steps in the substrate in which the integrated circuit is also manufactured. These auxiliary lithography structures are employed for the alignment of the next mask level as well as for the evaluation of the process steps. The auxiliary lithography structures are thus subject to the same process influences as the structures of the integrated circuit to be manufactured (see, for example, S. Wolf et al., Silicon Processing for the VLSI-Eras, Lattice Press, 1987, pp. 473–476).

Trench structures are being increasingly employed in circuit arrangements having an increased packing density. Among other things, such trench structures are filled with insulating material and are utilized as insulating trenches for insulation between neighboring circuit elements, for example between bipolar transistors or between power components and logic components. The trench structure is etched into the substrate. The auxiliary lithography structure is likewise subjected to the trench-etching process in the manufacture of the trench structure.

When the auxiliary lithography structures are broader than the trench structures—this being frequently the case in current technologies—a complete filling of the auxiliary lithography structures does not occur when filling deep trenches. The surface of the structure then comprises steps in the region of the auxiliary lithography structures, these steps leading to the fact that a reliable process management suitable for fabrication is no longer possible. This problem is especially serious in smart power technology on SOI material. Logic components and power components that are each respectively surrounded by an insulating trench that extends onto the surface of the insulating layer are thereby realized in a single-crystal silicon layer that is arranged on an insulating layer (see, for example, A. Nagakawa et al., ISPS 1990, pp. 97–101). In this employment, trench structures having widths of 1–3 µm and depths from 20–30 µm arise. Auxiliary lithography structures, whose geometry is usually prescribed by the apparatus manufacture, by contrast, comprise widths in the range from 3–30 µm.

SUMMARY OF THE INVENTION

The invention is based on the problem of specifying a method for manufacturing an integrated circuit arrangement wherein trench structures and auxiliary lithography structures are manufactured :such that a reliable process management suitable for fabrication is possible. In particular, high steps in the surface should be avoided for that purpose.

In the method of the invention, a trench structure is produced in a two-stage trench process that comprises at least two etching steps. A trench mask is thereby first produced at the surface of a substrate wafer by deposition of a layer and structuring of the layer. The structuring of the layer represents the first etching step of the trench process. Subsequently, the trench structure is realized in the substrate wafer in a second etching step. The material of the substrate wafer is attacked in the second etching step. In the trench process, an auxiliary lithography structure is simultaneously produced in the substrate wafer outside the integrated circuit arrangement. For example, auxiliary lithography structures are alignment marks, resolution patterns for focal and dimensional definition as well as verniers and other superimposition structures for identifying positional errors. In the manufacture of the trench mask, a protective structure that protects the substrate wafer in the region of the auxiliary lithography structure against an etching attack in the second etching step is formed in the region of the auxiliary lithography structure. For that purpose, for example, a layer that resists the second etching step is locally applied at the surface of the substrate wafer in the region of the auxiliary lithography structure.

Given a substrate wafer that comprises silicon at least in the region of a principal surface, the protective structure in the region of the auxiliary lithography structure can occur by surface-wide application of a layer sequence on the principal surface. The layer sequence comprises at least one $SiO_2$ layer arranged on the principal surface and a silicon layer arranged on the $SiO_2$ layer, and preferably composed of polysilicon. The silicon layer is now locally oxidized at least in the region of the trench structure, whereas the silicon layer in the region of the auxiliary lithography structure is not oxidized and remains in place here as a silicon layer.

The first etching step for manufacturing the trench mask is now implemented selectively relative to silicon, so that the etching in the region of the trench structure stops on the principal surface of the substrate wafer and stops on the silicon layer in the region of the auxiliary lithography structure. Both the oxide that arose due to local oxidation as well as the $SiO_2$ layer are etched through in the region of the trench structure in the first etching step. The $SiO_2$ layer is protected by the silicon layer in the region of the auxiliary lithography structure.

In the second etching step, the trench structure is produced by etching into the silicon of the substrate wafer. For that purpose, an etching selective relative to $SiO_2$ is employed that attacks only the silicon layer in the region of the auxiliary lithography structure, whereas it stops on the $SiO_2$ layer arranged therebelow. The $SiO_2$ layer acts as a protective structure here.

This embodiment of the method of the invention can be advantageously utilized in process sequences wherein field oxide regions are produced before the trench etching. In particular, these field oxide regions are formed in a modified LOCOS method that is known, for example, from R. Burroester et al., ESSCERC 1988. The local oxidation is implemented upon employment of a layer sequence of $SiO_2$, polysilicon and $Si_3N_4$. The described embodiment of the invention can be introduced into such a process without requiring an additional photo technique. The thickness of the $SiO_2$ layer that is arranged at the surface of the substrate wafer must be set to the selectivity of the etching utilized in the second etching step, and must also be set to the depth of the trench structure.

Both a SOI substrate as well as a single-crystal silicon substrate are suitable as a substrate wafer in the method of the invention. Given a single-crystal silicon substrate, the depth of the trench structure is set via the etching time.

The invention shall be set forth in greater detail below with reference to an exemplary embodiment and to the drawing figures.

BRIEF DESCRIPTION OF THE DRAWINGS

FIG. 3 shows the substrate wafer before the structuring of layers for producing a trench mask;

FIG. 4 shows the substrate; wafer after the first etching step;

DESCRIPTION OF THE PREFERRED EMBODIMENTS

The method of the invention is set forth with reference to the example of a 500 volt smart power process. The initial material is a substrate wafer 1 of SOI material. The substrate wafer 1 comprises a single-crystal silicon substrate 11, an insulating layer 12 of $SiO_2$ arranged thereon that has a thickness of, for example 2 µm, and a lightly n-doped monocrystalline silicon layer 13 arranged on the insulating layer 12 that, for example, is 20 µm thick. The substrate wafer 1 is preferably manufactured according to the direct wafer bonding (DWB) method that is known, for example, from A. Nagakawa et al., ISPS 1990, pp. 97 . 101.

Figure 1:
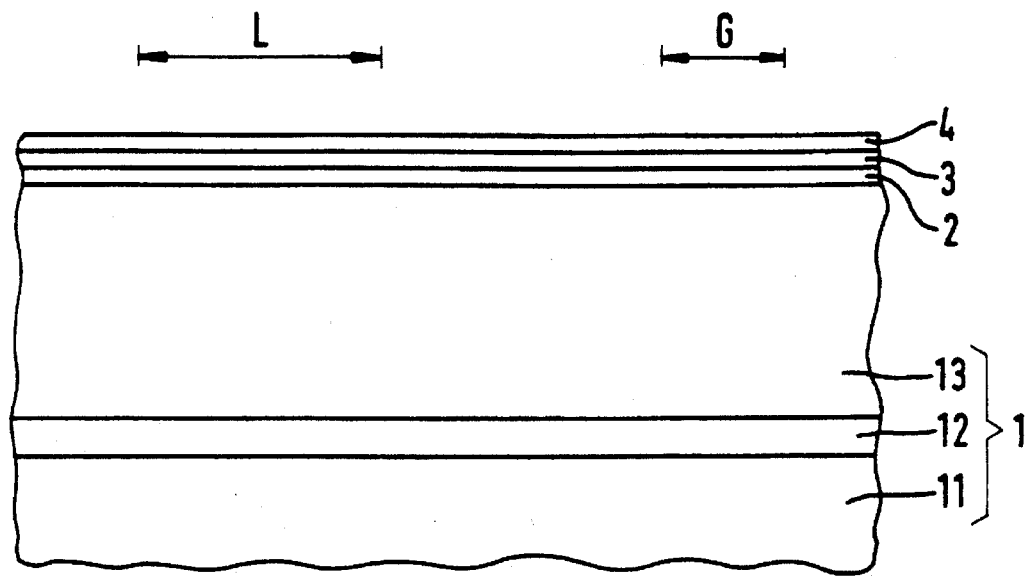
FIG. 1 shows a substrate wafer having a $SiO_2$ layer, a polysilicon layer and a $Si_3N_4$ layer.

A $SiO_2$ layer 2 is produced on the surface of the monocrystalline silicon layer 13, for example by thermal oxidation of the surface (see FIG. 1). The $SiO_2$ layer 2 is produced in a thickness in the range between 50 and 300 nm.

A polycrystalline silicon layer 3 having a thickness of, for example, 50–250 nm, is deposited onto the $SiO_2$ layer 2, and a $Si_3N_4$ layer 4 having a thickness of, for example 50–250 nm, is deposited on this polycrystalline silicon layer 3.

In FIG. 1, a region for an auxiliary lithography structure is referenced as double arrow L and a region for a trench structure is referenced as double arrow G. The auxiliary lithography structure is implemented as an inverse superimposition structure by contrast reversal.

Figure 2:
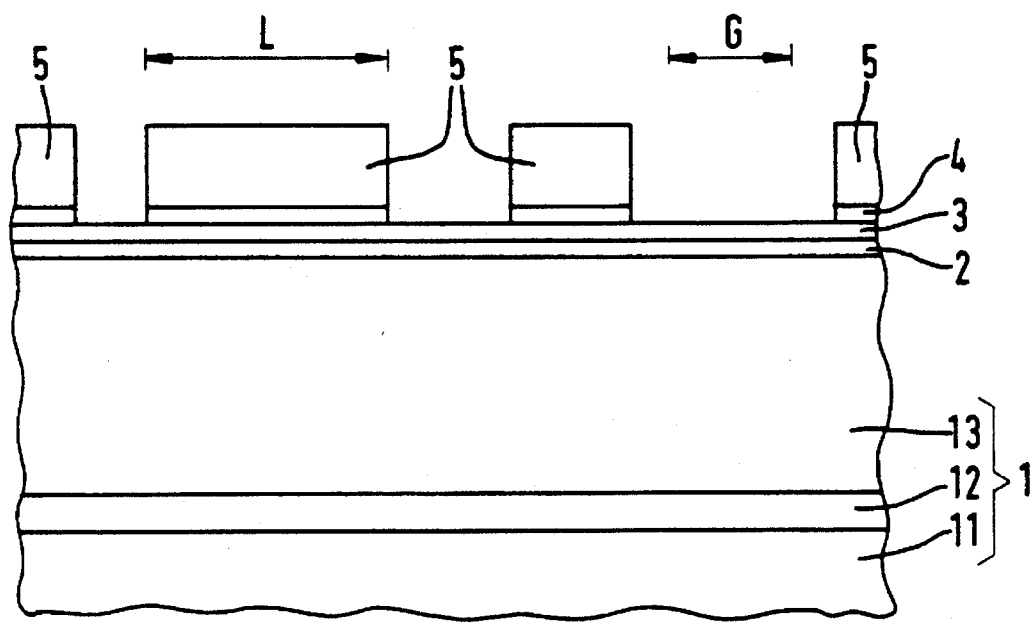
FIG. 2 shows the substrate; wafer after the structuring of the $Si_3N_4$ layer for a local oxidation.
Figure 5:
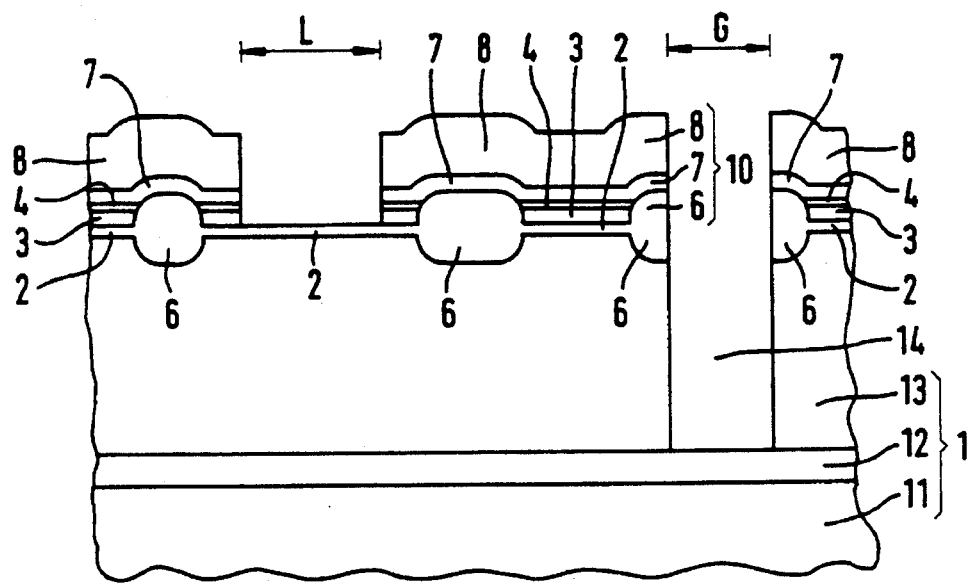
FIG. 5 shows the substrate; wafer after the second etching step.

A photo resist layer 5 is applied surface-wide and is exposed and developed such that the surface of the $Si_3N_4$ layer 4 is uncovered in the region G for the trench structure, whereas the photo resist remains on the $Si_3N_4$ layer 4 in the region L for the auxiliary lithography structure. The $Si_3N_4$ layer 4 is structured in an anisotropic dry etching process (see FIG. 2). The anisotropic dry etching process is preferably selective relative to polysilicon, so that the etching process stops at the surface of the polysilicon layer 3. For example, a plasma etching process with $CHF_3/O_2$ chemistry is suitable as an etching process.

Field oxide regions 6 are produced in the regions not covered by the structured $Si_3N_4$ layer 4. They are produced by local oxidation by use of the $Si_3N_4$ layer 4 as an oxidation mask (see FIG. 3). In the local oxidation, the uncovered parts of the polysilicon layer 3 are completely oxidized. Since the region L for the auxiliary lithography structure is covered by the $Si_3N_4$ layer 4, the polysilicon layer 3 is preserved in this region. The surface of the polysilicon layer 3, by contrast, is uncovered in the region G for the trench structure, so that the polysilicon here is completely oxidized.

After the removal of the photo resist layer 5, a further $Si_3N_4$ layer 7 is deposited in surface-wide fashion with a thickness of, for example 20–200 nm, and a further $SiO_2$ layer 8 is deposited thereon iin a thickness of, for example 200–1,000 nm. The further $SiO_2$ layer 8 is deposited in a CVD method. The further $SiO_2$ layer 8 must be suitable for a trench mask. In particular, it is required for setting the sidewalls of the trench structure. The further $Si_3N_4$ layer 7 serves as an etch stop for the later removal of the $SiO_2$ layer 8 in a wet-chemical etching process.

A further photo resist layer 9 is applied surface-wide, and is exposed and developed such that both the region G for the trench structure as well as the region L for the auxiliary lithography structure are uncovered.

Subsequently, a first etching step is implemented for producing a trench mask 10 (see FIG. 4). For that purpose, an anisotropic dry etching process is employed that etches $SiO_2$ and $Si_3N_4$ with nearly the same etching rates, but that etches silicon with a substantially lower etching rate. The further $SiO_2$ layer 8 and the further $Si_3N_4$ layer 7 are therefore structured in the first etching step. The etching stops on the surface of the polysilicon layer 3 in the region L of the auxiliary lithography structure. By contrast thereto, the field oxide region 6 is likewise etched through in the region G for the trench structure, and the etching stops on the surface of the monocrystalline silicon layer 13 (see FIG. 4). The trench mask 10 is formed in the region G for the trench structure by the field oxide region 6, by the further $Si_3N_4$ layer 7, as well as by the further $SiO_2$ layer 8. For example, a $CHF_3/O_2$ plasma is suitable as an etching process for the first etching step.

The further photo resist layer 9 is removed after the first etching step. A second etching step is implemented. For that purpose, an anisotropic dry etching process is employed that etches silicon highly selectively relative to $SiO_2$. In particular, a plasma etching process with $HBr/NF_3+He/O_2$ chemistry is suitable for this purpose. This process has a selectivity of approximately 100:1 for etching silicon relative to $SiO_2$.

The etching in the second etching step therefore stops on the surface of the insulating layer 12 of $SiO_2$ in the region G for the trench structure, as a result whereof a trench structure 14 is produced in the region of the monocrystalline silicon layer 13. The trench structure 14 comprises a depth corresponding to the thickness of the monocrystalline silicon layer 12, i.e. a depth of 20 µm and a width of 2 µm. The uncovered polysilicon layer 3 is removed in the region L for the auxiliary lithography structure in the second etching step. The etching in the second etching step then stops on the surface of the $SiO_2$ layer 2 that acts as a protective structure for the auxiliary lithography structure in the region L. The thickness of the $SiO_2$ layer 2 must therefore be set to the depth of the trench structure 14 and to the selectivity of the etching employed in the second etching step. Particularly when manufacturing trench structures having depths greater than 20 µm, the required thickness of the $SiO_2$ layer 2 can thereby be greater than required for the local oxidation (LOCOS) for the formation of the field oxide regions in a standard CMOS process in which the inventive method for producing the trench structure is embedded.

If it does not seem justifiable for purposes of the overall process to select the thickness of the $SiO_2$ layer correspondingly greater, it lies within the scope of the invention to locally produce an additional $SiO_2$ structure (not shown) in the region L for the auxiliary lithography structure before the deposition of the $SiO_2$ layer 2. This can occur by local oxidation or by deposition of $SiO_2$. A mask is required for this purpose. It is especially advantageous to implement this $SiO_2$ structure in a preceding process step of the overall process, for example an implantation, with a mask employed for that purpose, so that a further mask is in fact required for the manufacture of the SiO$_2$ structure. This further mask, however, is not an additional mask in the overall process.

Figure 6:
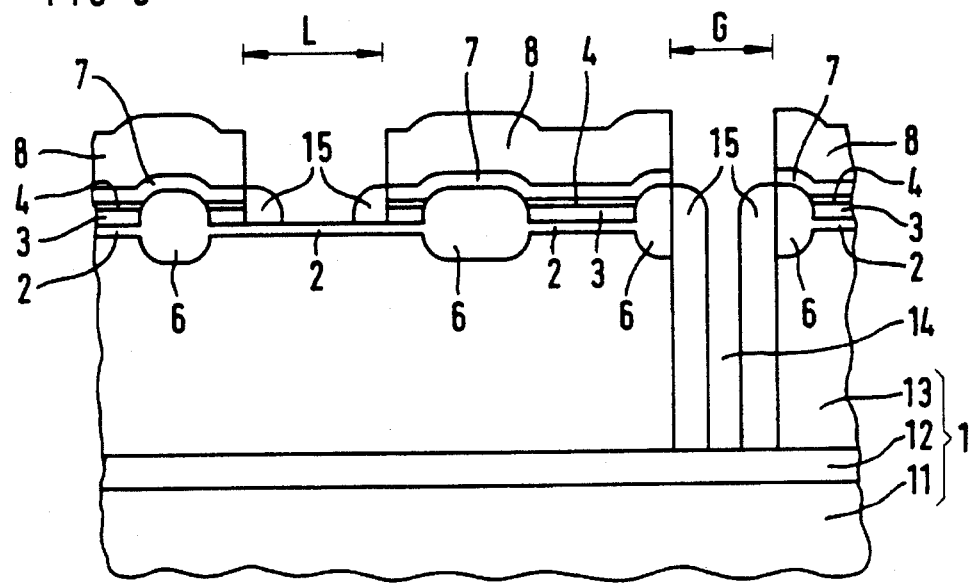
FIG. 6 shows the substrate wafer after the formation of spaces along the walls of the trench structure.

The trench structure 14 is subsequently filled in conformity with the planned use. For that purpose, for example, an amorphous silicon layer having an essentially conformal edge coverage is first deposited in surface-wide fashion and anisotropically etched, as a result whereof silicon spaces 15 are formed along vertical sidewalls (see FIG. 6).

Figure 7:
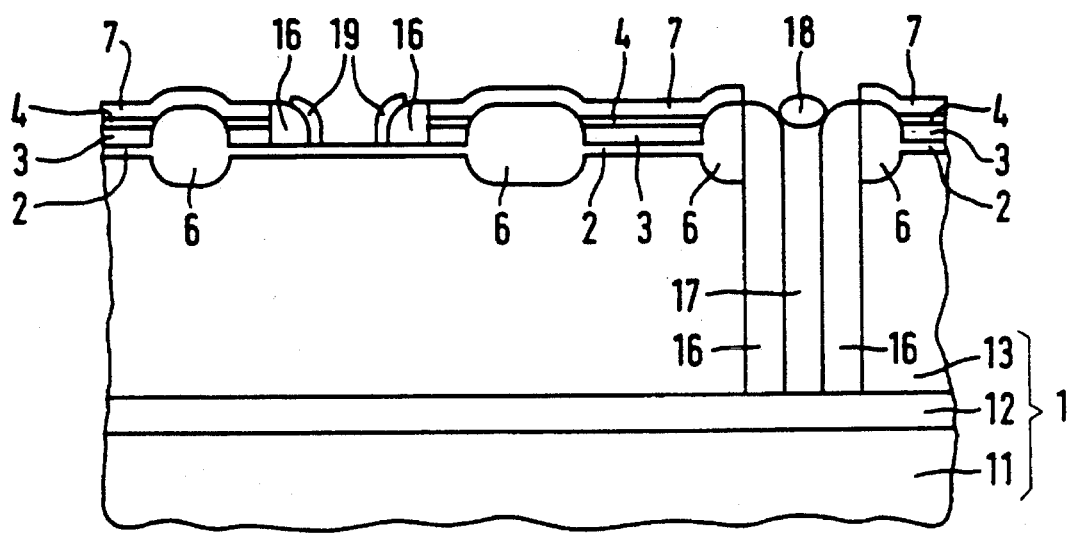
FIG. 7 shows the substrate wafer after the filling of the trench structure.

Subsequently, the further SiO$_2$ layer 8 is wet-chemically removed, whereby the further Si$_3$N$_4$ layer 7 acts as an etching stop (see FIG. 7). SiO$_2$ spacers 16 are formed in the trench structure 14 as well as in the region of the auxiliary lithography structure by oxidation of the silicon spacers 15. By repeated deposition of amorphous silicon having essentially conformal edge coverage, the trench structure 14 is filled with a silicon fill 17. The trench structure 14 is closed with a SiO$_2$ termination 18 by oxidation of the silicon fill 17. Simultaneously, further SiO$_2$ spacers 19 are formed in the region L of the auxiliary lithography structure (see FIG. 7).

The conventional process steps of an overall process can be continued after the removal of the further Si$_3$N$_4$ layer 7, of the Si$_3$N$_4$ layer 4, of the polysilicon layer 3, as well as of the SiO$_2$ layer 2.

Both the SiO$_2$ termination 18 as well as the field oxide regions 6 are thinned in the removal of the SiO$_2$ layer 2. Since the thickness of the SiO$_2$ layer 2 is prescribed by the oxide erosion in the second etching step, this must be intercepted by a longer local oxidation for producing the field oxide regions 6, or for producing the SiO$_2$ termination 18. In applications where this is not possible, for example because of an enlargement of the lateral expanse of the field oxide regions 6 due to an enlarged bird's bill length, a SiO$_2$ structure can also be locally produced here in the region L of the auxiliary lithography structure before the deposition of the SiO$_2$ layer 2.

Due to the SiO$_2$ spacers 16, 19, elevations remain in the region L of the auxiliary lithography structure after the removal of the layer sequence. These elevations can be employed in common with the neighboring field oxide regions for the alignment of the next mask level as well as for the evaluation of the process steps. These elevations cause irregularities in the surface in the range of a few 100 nm, much like the irregularities also caused by gate electrodes or other elevations in the circuit structures. Irregularities on this order of magnitude are acceptable for the purpose of a reliable and fabrication suited process management.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for manufacturing a trench structure and an auxiliary lithography structure employed in an integrated circuit arrangement, comprising the steps of:

producing the trench structure in a substrate wafer by use of a trench mask in a trench process comprising at least first and second etching steps, the first etching step comprising producing the trench mask by structuring at least one layer and the second etching step comprising providing the trench structure in the substrate wafer;

producing the auxiliary lithography structure outside the circuit arrangement during the trench process on the substrate wafer; and forming a protective structure for protecting the substrate wafer in a region of the auxiliary lithography structure against an etching attack during the first etching step in the manufacture of the trench mask.

2. A method according to claim 1, including the steps of:

producing a SiO$_2$ structure in the region of the auxiliary lithography structure before the production of the trench mask; and performing the second etching step selectively relative to SiO$_2$.

3. A method according to claim 1, including the steps of:

providing the substrate wafer as comprising silicon at least in a region of a principal surface of the substrate wafer;

applying at least one SiO$_2$ layer on the principal surface of the wafer, and a silicon layer on said at least one SiO$_2$ layer for the manufacture of the trench mask and for said protective structure;

locally oxidizing said silicon layer at least in a region of the trench structure, said silicon layer not being oxidized in the region of the auxiliary lithography structure; and the first etching step for the manufacture of the trench mask occurring selectively relative to silicon so that etching stops on the principal surface of the substrate wafer in the region of the trench structure and stops on the silicon layer in the region of the auxiliary lithography structure.

4. A method according to claim 3, including the steps of:

arranging a Si$_3$N$_4$ layer on said silicon layer, and a photo resist layer on said Si$_3$N$_4$ layer;

exposing the photo resist layer and developing it so that the Si$_3$N$_4$ layer is uncovered in the region of the trench structure and the Si$_3$N$_4$ layer remains covered with photo resist in the region of the auxiliary lithography structure;

structuring the Si$_3$N$_4$ layer in an anisotropic etching process;

forming field oxide regions by local oxidation;

removing the photo resist layer;

depositing a further SiO$_2$ layer surface-wide over the field oxide regions and the Si$_3$N$_4$ layer;

applying a further photo resist layer on the SiO$_2$ layer and exposing and developing it such that said further SiO$_2$ layer is uncovered in the region of the trench structure and in the region of the auxiliary lithography structure;

utilizing an anisotropic dry etching process that attacks SiO$_2$ selectively relative to silicon in said first etching step until said principal surface of the substrate wafer is uncovered in the region of the trench structure and until a surface of the silicon layer is uncovered in the region of the auxiliary lithography structure;

removing the further photo resist layer; and utilizing an anisotropic dry etching process that attacks silicon selectively relative to SiO$_2$ for finishing said trench structure in the second etching step.

5. A method according to claim 4 including the steps of:

depositing a further Si$_3$N$_4$ layer on said Si$_3$N$_4$ layer and said field oxide regions for the deposition of said further SiO$_2$ layer over said field oxide regions and said Si$_3$N$_4$ layer; and utilizing an anisotropic etching process that attacks SiO$_2$ and Si$_3$N$_4$ selectively relative to silicon in said first etching step.

6. A method according to claim 5 including the step of utilizing a plasma etching with $CHF_3/O_2$ chemistry in said first etching step and utilizing a plasma etching with $HBr/NF_3+He/O_2$ chemistry in said second etching step.

7. A method according to claim 1 including the step of filling the trench structure by a conformal deposition of a layer and anisotropically etching that layer.

8. A method according to claim 1 including the steps of:

employing as said substrate wafer a SOI substrate followed by an insulating layer which is in turn followed by a monocrystalline silicon layer;

producing said trench structure in said monocrystalline silicon layer; and uncovering a surface of the insulating layer with the trench structure in the second etching step.

9. A method for manufacturing a trench structure and an auxiliary lithography structure employed in an integrated circuit arrangement, comprising the steps of:

providing a protective insulating layer on a substrate wafer;

in a first etching step, producing a trench mask by structuring the protective layer at a region where said trench mask is desired so that an upper surface of said substrate wafer is exposed;

in a second etching step, providing the trench structure in the substrate wafer by use of said trench mask;

producing the auxiliary lithography structure outside the circuit arrangement during steps for creating the trench structure; and said protective layer protecting the substrate wafer in a region of the auxiliary lithography structure against an etching attack during the second etching step in the manufacture of the trench mask.

* * * * *